(12) United States Patent
Smith

(10) Patent No.: US 7,723,985 B2
(45) Date of Patent: May 25, 2010

(54) ALTERED SWEEP BELL-BLOOM MAGNETOMETER

(75) Inventor: Kenneth R. Smith, Fremont, CA (US)

(73) Assignee: Geometrics, Inc., San Jose, CA (US)

( * ) Notice: Subject to any disclaimer, the term of this patent is extended or adjusted under 35 U.S.C. 154(b) by 578 days.

(21) Appl. No.: 11/753,750

(22) Filed: May 25, 2007

(65) Prior Publication Data

US 2008/0290867 A1    Nov. 27, 2008

(51) Int. Cl.
    *G01V 3/00*    (2006.01)
(52) U.S. Cl. .................................... 324/301; 324/300
(58) Field of Classification Search ......... 324/300–322;
    331/3, 94.1; 327/39, 32; 372/11, 106; 368/10
    See application file for complete search history.

(56) References Cited

U.S. PATENT DOCUMENTS

| 2,837,649 | A * | 6/1958 | Hershberger ................... 331/3 |
| 6,919,770 | B2 * | 7/2005 | Happer et al. .............. 331/94.1 |
| 7,102,451 | B2 * | 9/2006 | Happer et al. .............. 331/94.1 |
| 7,202,751 | B2 * | 4/2007 | Zhu et al. ....................... 331/3 |
| 7,276,902 | B1 * | 10/2007 | Xiang et al. ................. 324/300 |
| 7,439,814 | B2 * | 10/2008 | Happer et al. .................. 331/3 |

* cited by examiner

*Primary Examiner*—Brij B Shrivastav
(74) *Attorney, Agent, or Firm*—Beyer Law Group LLP

(57) ABSTRACT

A magnetometer is constructed wherein the sweeping is performed at one half the Larmor frequency and has as its center the absorption line. This allows the emitter to tune onto the absorption line twice per cycle as it passes through the line. This causes the increase in absorption as would the normal sweep of a Bell-Bloom magnetometer but avoids the drawbacks, such as drift and heading error.

21 Claims, 7 Drawing Sheets

ALTERED SWEEP BELL-BLOOM MAGNETOMETER

BACKGROUND OF THE INVENTION

1. Field of the Invention

The present invention relates to the field of magnetometers. More specifically, the present invention relates to a Bell-Bloom magnetometer having an altered sweep.

2. Description of the Related Art

Magnetometers are used to measure the strength and direction of a magnetic field. They can be useful in measuring minute changes in the Earth's magnetic field that allow users to identify geological conditions under the Earth's surface, such as the location of oil and mineral deposits, as well as other conditions.

FIG. 1 is a diagram of a typical Bell-Bloom Magnetometer. A Bell-Bloom Magnetometer involves the use of a photon emitter 100 containing a cesium light emitter or lamp, an absorption cell 102 containing cesium vapor and sometimes a "buffer gas", and a photon detector 104. The photon emitter 100 emits photons through the absorption cell 102 and the photo detector 104 detects changes in the photons that pass through the cesium vapor.

The basic principle that allows the device to operate is the fact that a cesium atom can exist in any of nine energy levels, which involve the placement of electron atomic orbital's around the atomic nucleus. When a cesium atom within the cell encounters a photon from the emitter, it jumps to a higher energy state and then re-emits a photon and falls to an indeterminate lower energy state. The cesium atom is "sensitive" to the photons from the emitter in three of its nine energy states, and therefore all of the atoms will fall into a state through which all the photons from the emitter will pass through unhindered and measured by the photon detector. At this state, the Cesium in the cell is saturated.

Once the Cesium is saturated, the system is prepared for the measurement procedure. The axis of the spin and orbital motion of the electrons precesses about the ambient magnetic field. This precession causes the alignment between the electron and the light to vary, in a cyclic manner, between an alignment that favors the absorption of light and one that reduces the absorption. If the light is pulsed on and off at the same frequency as the precession rate of the electrons, those electrons that are aligned such that they absorb the light will be drive to a higher energy level. These electrons will then fall back to the lower state. When the electrons return to the lower state, the phase of their precession will have been changed. If the precession is now such that the electron is aligned so as to not absorb light when the light pulses on, the electronic will remain in this state. Thus, when the light is pulsed on and off at a rate equal to the precession rate, the absorption in the cell is decreased.

The light from the emitter is typically swept on an off of what is called an absorption line. This is the wavelength at which the absorption in the cell is maximized. In existing Bell-Bloom systems, the absorption line is swept at a frequency known as the Larmor frequency, which is the resonate frequency of the underlying material and is proportional to the strength of the magnetic field. FIG. 2 is a diagram of the typical sweep on and off the absorption line at the Larmor frequency. As can be seen, the wavelength of light 200 from the emitter is varied in an attempt to approach right up to, and then come off, the center of the absorption line 202, and the rate of variation is performed at the Larmor frequency 204.

A Bell-Bloom magnetometer typically tracks the variation in the Larmor frequency, which can be used to track the strength of the magnetic field, by slightly varying the rate at which the emitter is swept and observing the variation in absorption with the frequency of the sweeping.

The absorption line, however, is not a single line but a small group of lines that are wider than their spacing so as to appear as a single line. The Larmor frequency for the different sub lines is slightly different. As the emitter is swept off the line, it tends to bias towards the line on the side to which it is sweeping. As a result, the details of the sweeping waveform affect the absolute value of the reading, leading to drift and heading error. Additionally, the signal gain varies with the angle between the ambient field and the light path. This causes the frequency response of the system to vary, leading to inaccuracies.

Furthermore, a semiconductor laser emitter does not naturally produce the exact wavelength of light needed. The wavelength is controlled by varying the temperature of the laser. The laser is tuned to the center of the line by varying its own "on the line" point slightly and adjusting it so that the absorption decreases equally on each side. This variation in the tuning of the laser causes a variation in the Larmor frequency which appears a variation in the measured magnetic field.

What is needed is a solution that does not suffer from the drawbacks of the prior art.

SUMMARY OF THE INVENTION

A magnetometer is constructed wherein the sweeping is performed at one half the Larmor frequency and has as its center the absorption line. This allows the emitter to tune onto the absorption line twice per cycle as it passes through the line. This causes the increase in absorption as would the normal sweep of a Bell-Bloom magnetometer but avoids the drawbacks, such as drift and heading error.

DETAILED DESCRIPTION OF SPECIFIC EMBODIMENTS

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, specific details are set forth in order to provide a thorough understanding of the present invention. The present invention may be practiced without some or all of these specific details. In addition, well known features may not have been described in detail to avoid unnecessarily obscuring the invention.

In an embodiment of the present invention, rather than attempting to sweep to the absorption line at the Larmor frequency and then back off of the absorption line, a magnetometer is constructed wherein the sweeping is performed at one half the Larmor frequency and has as its center the absorption line. This allows the emitter to tune onto the absorption line twice per cycle as it passes through the line. This causes the decrease in absorption as would the normal sweep of a Bell-Bloom magnetometer but avoids the drawbacks, such as drift and heading error.

Figure 1:
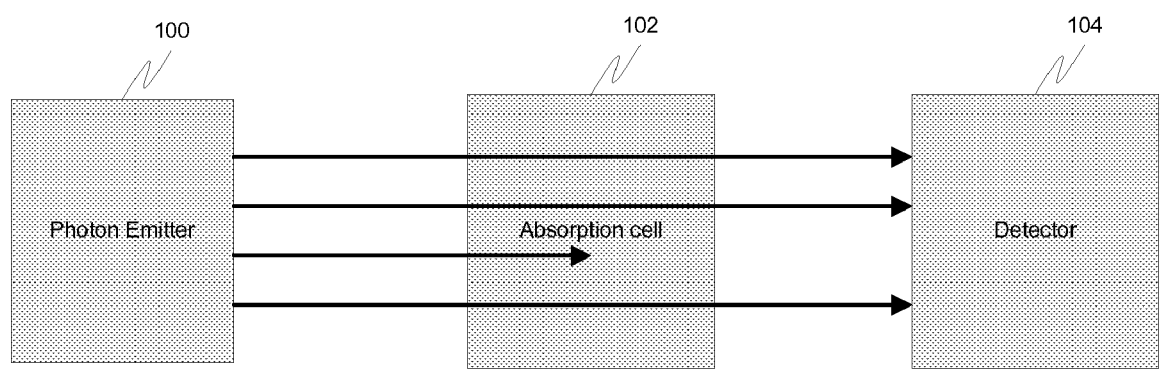
FIG. 1 is a diagram of a typical Bell-Bloom Magnetometer.
Figure 2:
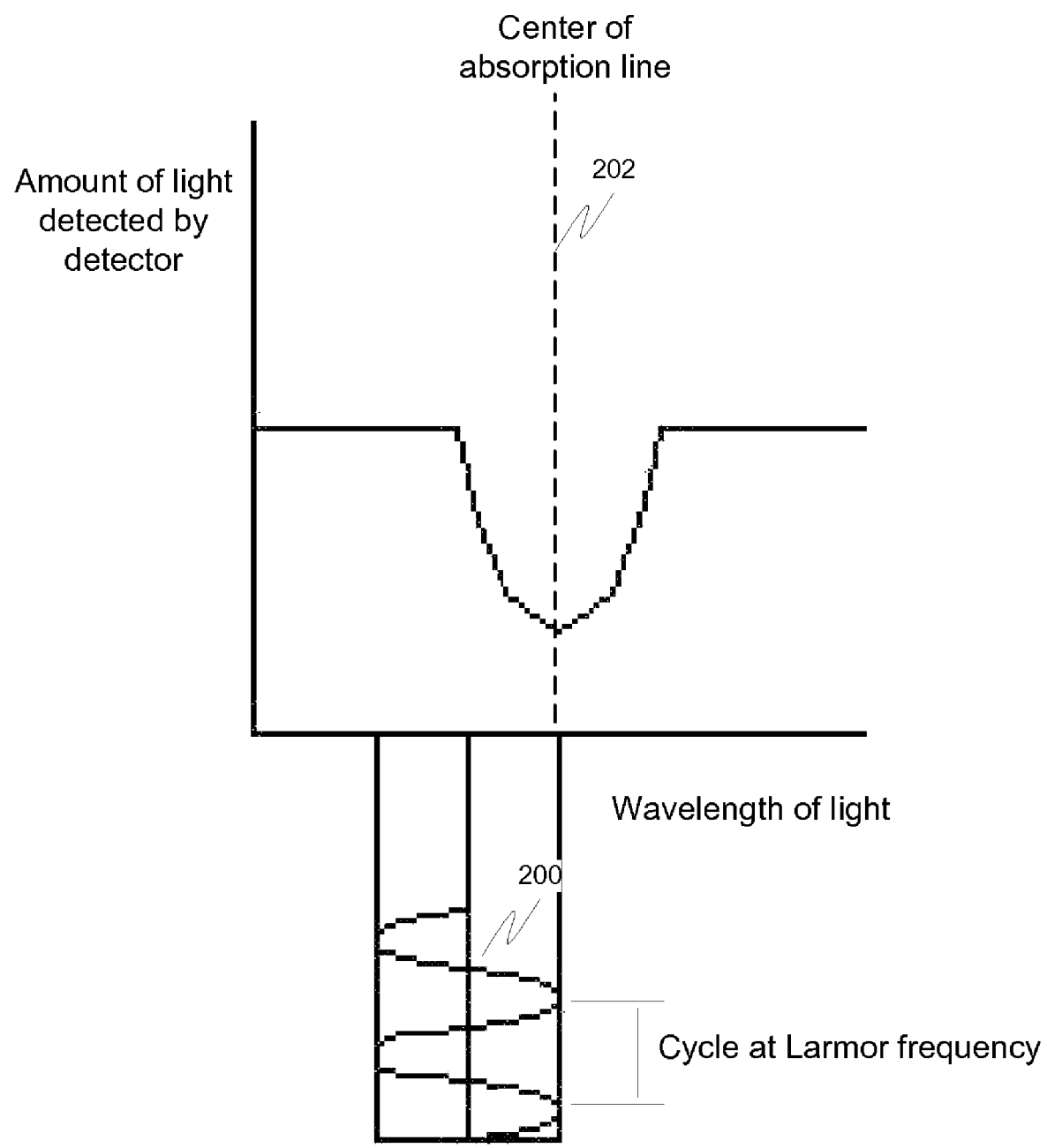
FIG. 2 is a diagram of the typical sweep on and off the absorption line at the Larmor frequency.
Figure 3:
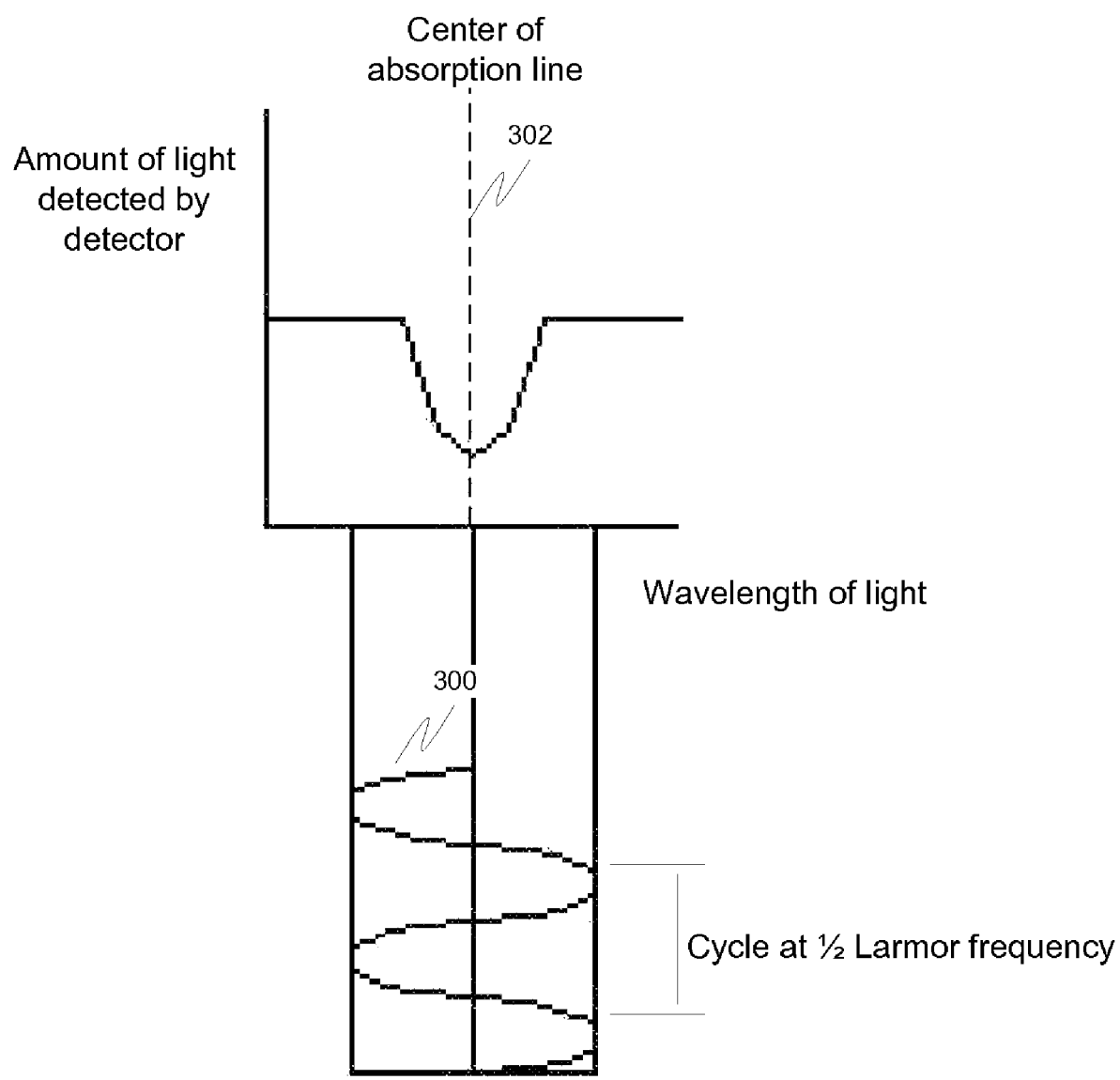
FIG. 3 is a diagram of a sweep through the absorption line at one half the Larmor frequency in accordance with an embodiment of the present invention.

FIG. 3 is a diagram of a sweep through the absorption line at one half the Larmor frequency in accordance with an embodiment of the present invention. As can be seen, the wavelength of light 300 is swept past the center of the absorption line 302 at one half the Larmor frequency.

Specifically, by sweeping completely past the absorption line, it is possible to detect the center point of the absorption line without the need for extra modulation of the emitter. Furthermore, the sweep of the emitter does not stop and reverse direction while it is on the absorption line. It is therefore possible to control the time rate of change in wavelength as the emitter sweeps through the absorption line. The function that this rate of change describes can be optimized to optimize the distribution of pumping among the sub lines and reduce heading error.

Furthermore, when detecting the center of the line as described above, the measured light from the two extremes of the sweep can be used to correct for any variation in laser or emitter intensity.

Additionally, a controlled rate of change as suggested above can also be used to make the magnetometer's absolute value insensitive to small mistunings of the laser.

Furthermore, the portion of light that the absorption cell absorbs is a function of the vapor pressure within the cell. This provides a mechanism to determine the temperature of the cell without the need for a thermistor. A servo system can then use this as a part of its feedback to maintain a constant cell temperature. By removing the necessity of a thermistor, it makes it easier to create microscopic sized components.

Additionally, in certain circumstances, a small error may be introduced into the servo system because the absorption also depends upon the angle between the lines of magnetic force and the optical path. The modulating of the rate of sweeping of the light emitter to either side of the Larmor frequency causes a variation in the absorption. This variation in absorption has frequency components at even harmonics of the modulating frequency. The amplitude of these harmonics depends on the vapor pressure in the absorption cell and also on the angle between the magnetic lines of force and the direction in which the light passes through the cell. Therefore, the cell temperature servo may be made insensitive to the angle of the magnetic field using a combination of the total absorption and the amplitude of the even harmonics.

The amplitude of the even harmonics of the Larmor modulation as a fraction of the total absorption may also be used to obtain a measurement of the angle between the magnetic field and the direction of the light.

Furthermore, any heading error of the magnetometer will be a function of the angle between the magnetic field and the direction of the light. The magnetometer may use the measurement of this angle to improve drift performance without compromised heading error.

Figure 4:
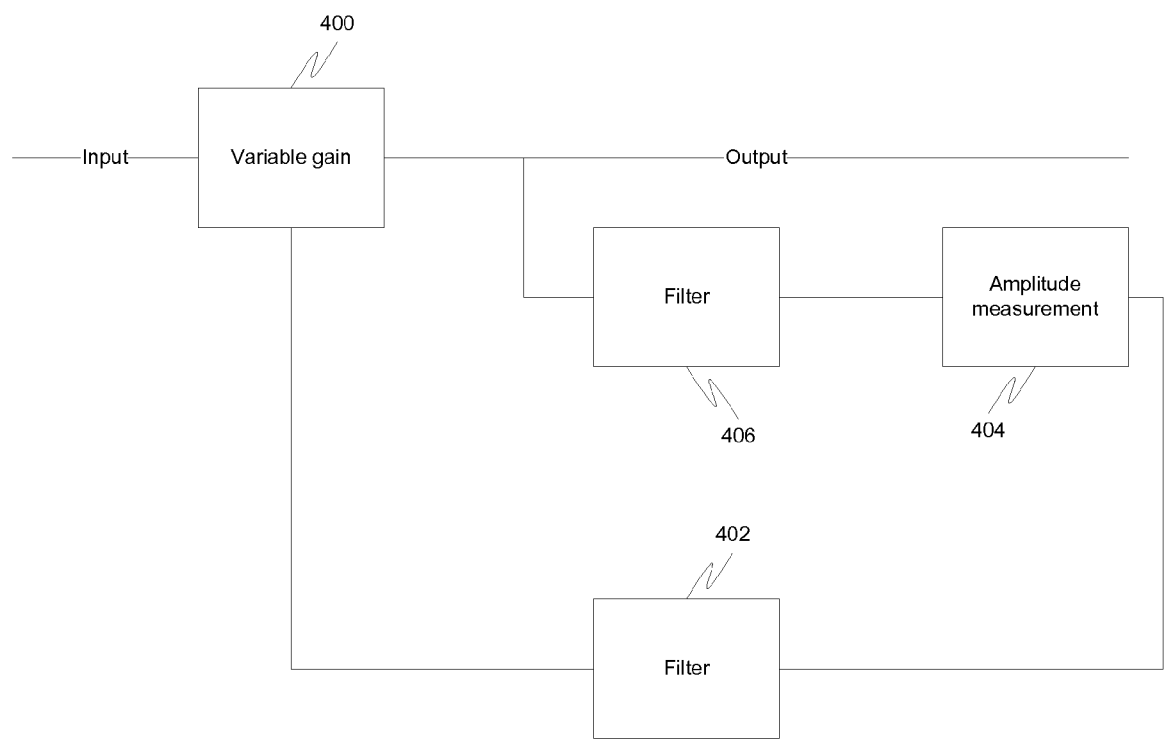
FIG. 4 is a block diagram of an example a closed loop automatic gain control circuit in accordance with an embodiment of the present invention.

In the Bell-Bloom magnetometer, the fundamental signal developed by modulating the Larmor signal depends on the offset between the Larmor signal and the ideal Larmor frequency and the angle between the magnetic field and the direction of the light in the absorption cell. In the prior art, this would cause the frequency response of the magnetometer to vary with the angle. In an embodiment of the present invention, the amplitude of the even harmonics of the modulation frequency is used to make the frequency response less dependent on angle. The ideal function for this correction may be approximated by division. This division may be implemented in closed loop form by using a closed loop automatic gain control circuit where the circuit controls the amplitude of the even harmonics in its output. An example of such a closed loop automatic gain control circuit is depicted in FIG. 4. A variable gain controller 400 amplifies an input signal by an amount controlled by a feedback signal from the low pass filter 402. The output of the variable gain amplifier is applied to a band pass filter 406 that passes only the second harmonic component of the input signal. The output of the band pass filter 406 has an amplitude measured by amplitude measurement component 404, which measures the amplitude. A voltage dependent on the amplitude is then produced and applied to the low pass filter 402.

The division may also be implemented in open loop form through the use of a homomorphic automatic gain control system. In a homomorphic automatic gain control system, the signal is separated into two paths. In one path the sign of the signal is determined while in the other the absolute value is taken. The absolute value may then have its natural logarithm taken to take advantage of the fact that $\ln(AB)=\ln(A)+\ln(B)$. If "A" is a signal at a frequency much less than the frequency of the signal "B", the $\ln(A)$ will be a slowly varying signal and thus can be filtered out by means of a high pass filter. Once $\ln(A)$ has been filtered the exponent may be taken and the sign may be restored to the signal.

Figure 5:
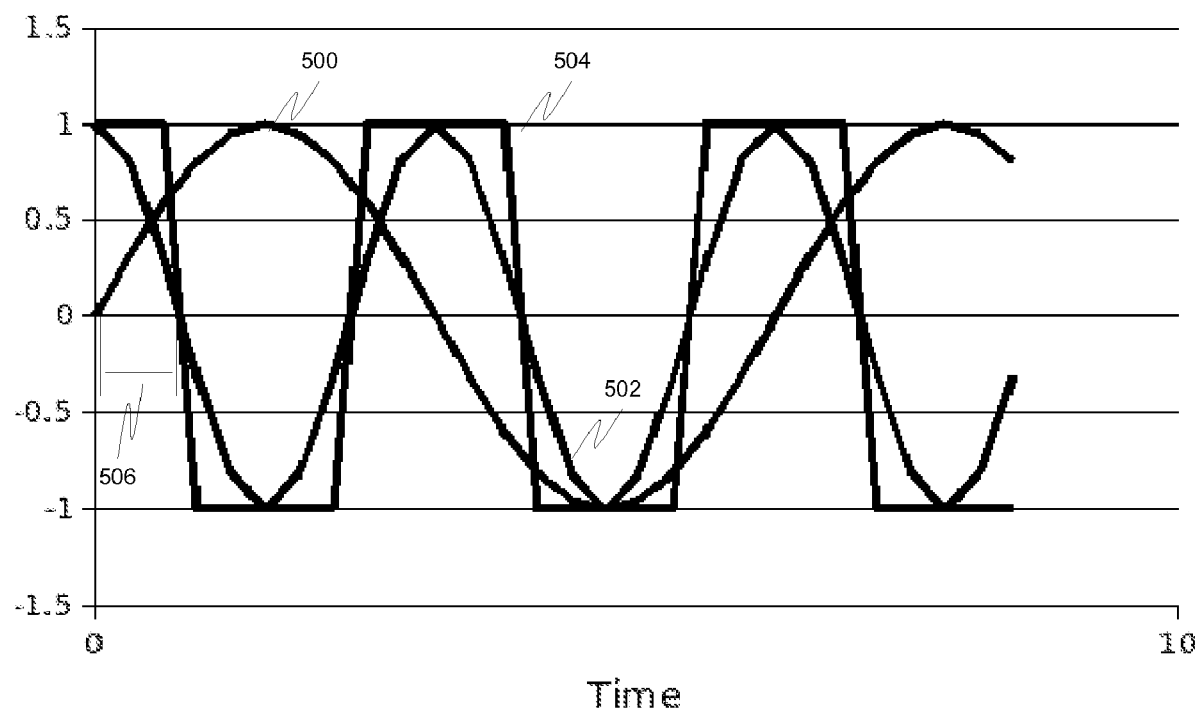
FIG. 5 is a diagram illustrating a signal composed of a small fundamental and a much larger even harmonic.
Figure 6:
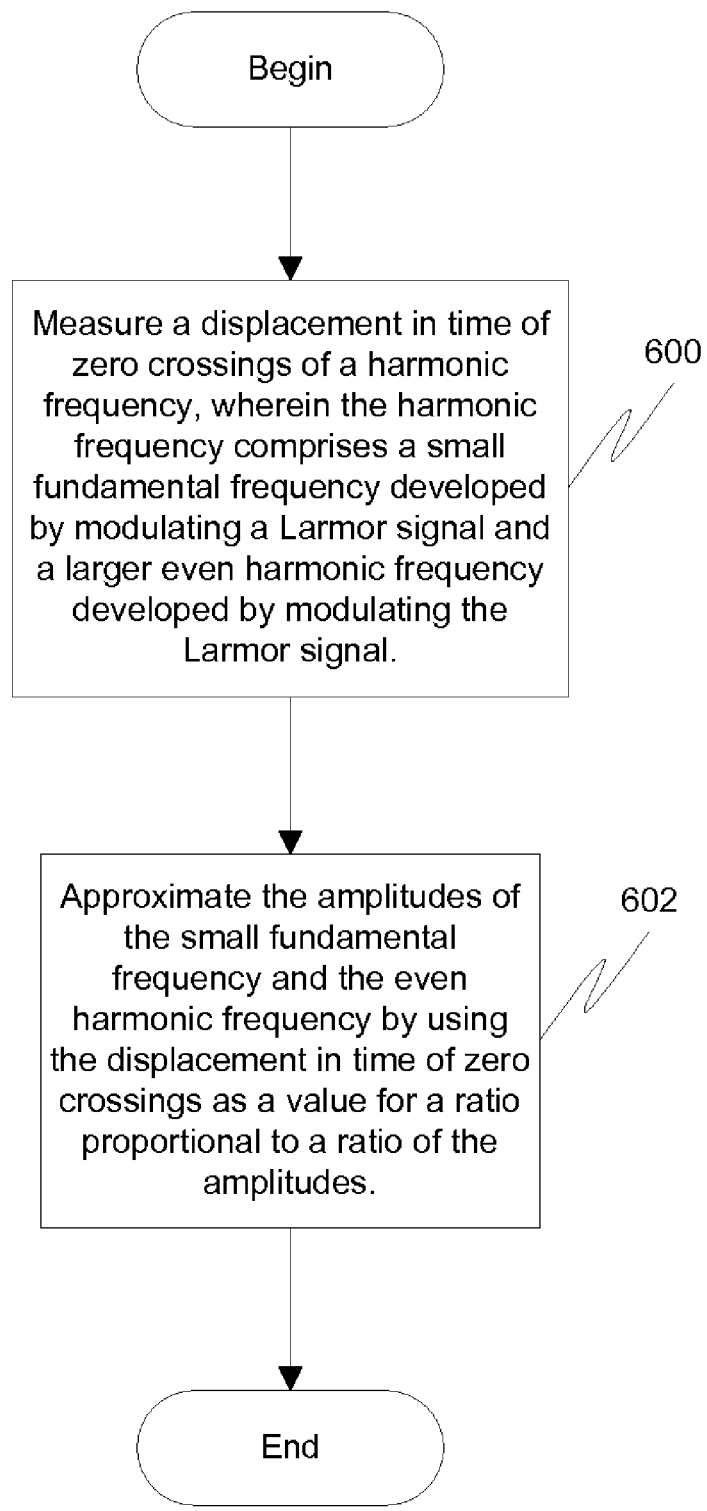
FIG. 6 is a flow diagram illustrating a method for approximation of a function for frequency response correction in a magnetometer in accordance with an embodiment of the present invention.

In an embodiment of the present invention, the function for frequency response correction may be approximated by pulse width modulation. As depicted in FIG. 5, if the sign of a signal composed of a small fundamental 500 and a much larger even harmonic 502 (or harmonics) is taken, the output will be similar in appearance to a square wave 504 at the harmonic frequency. The fundamental component causes a displacement 506 in time of the zero crossings of the output. Therefore, the time by which the zero crossings of the square wave are displaced is proportional to the ratio of the amplitudes of the fundamental and harmonic(s). This process is also described in the flow diagram of FIG. 6. At 600, a displacement in time of zero crossings of a harmonic frequency may be measured, wherein the harmonic frequency comprises a small fundamental frequency developed by modulating a Larmor signal and a larger even harmonic frequency developed by modulating the Larmor signal. At 602, the amplitudes of the small fundamental frequency and the even harmonic frequency may be approximated by using the displacement in time of zero crossings as a value for a ratio proportional to a ratio of the amplitudes.

The pulse width modulation signal described above may additionally be converted to a digital number. This digital number may only be a single bit and can be used to increment and decrement a counter. The counter may be used as the integrator portion of a servo system to cause the Larmor signal to track the ideal Larmor. This counter may be fitted with a circuit that causes repeated bits of the same value to cause increasing increment values and differing bits to cause decreasing increment values. The increment can be decreased to zero for small errors, as only the proportional part of the servo is needed. If the signal is indeed digitized, the processing can then be carried out digitally.

Figure 7:
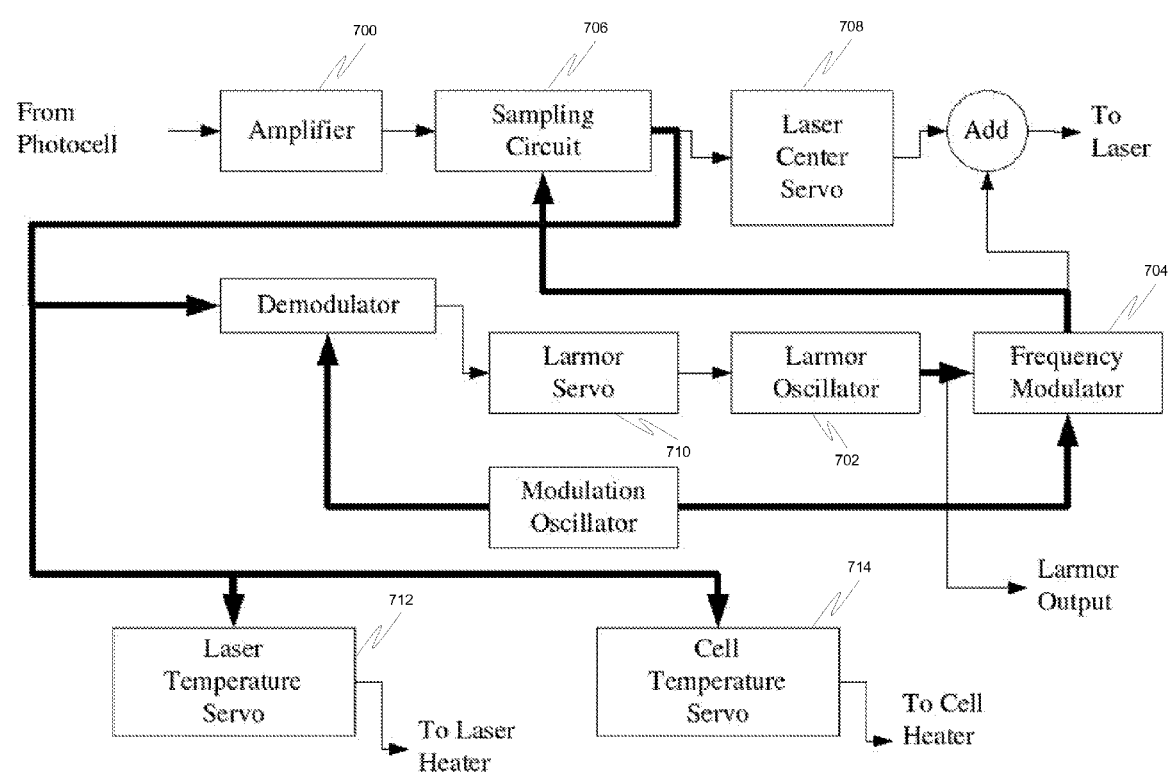
FIG. 7 is a block diagram illustrating a portion of a Bell-Bloom magnetometer in accordance with an embodiment of the present invention.

FIG. 7 is a block diagram illustrating a portion of a Bell-Bloom magnetometer in accordance with an embodiment of the present invention. For purposes of clarity, the portions of the system needed only during the start up phase of operation are not included in this figure. The interconnections between components shown as heavy lines represent multiple signals or signals represented as digital numbers.

The signal from the photocell is often too small to be used directly. Therefore, an amplifier 700 may be used before further processing done. The amplifier 700 may also contain an automatic gain control (ACG). A Larmor Oscillator 702 is a voltage controlled or numerically controlled oscillator that produces a signal that the system will make equal to the Larmor frequency. In the improved Bell-Bloom magnetometer of the present invention, this circuit also creates a signal or group of signals at one half of the Larmor frequency. The multiple signals may represent different phases in the cycle. A frequency modulator 704 takes the Larmor frequency as input, as well as a modulating signal that produces a frequency modulated signal where the modulation is performed symmetrically about the Larmor frequency. A sampling circuit 706 may sample the amplified signal from amplifier 700 at various points in the cycle of the signal from the frequency modulator 704. The values of these samples may be assumed to be held until the frequency modulator's output returns to that point in the cycle.

There are also four interconnect servo loops. These include a laser center servo 708, a Larmor servo 710, a laser temperature servo 712, and a cell temperature servo 714. The laser center servo 710 uses some of the signals from the sampling circuit 706. For example, samples representing four points may be used. The points where the laser is only slightly detuned from the center of the line are of primary importance. If the process by which the laser's wavelength is controlled did not also affect the brightness of the laser, the difference between these points would indicate any misalignment between the center of the laser's modulation and the absorption line. Since the brightness is changed, the difference needs to be corrected by examining samples from points where the laser is displayed.

The Larmor servo 712 may cause the Larmor signal to track the ideal Larmor. A counter may be fitted with a circuit that causes repeated bits of the same value to cause increasing increment values and differing bits to cause decreasing increment values. The increment can be decreased to zero for small errors, as only the proportional part of the servo is needed.

A laser temperature servo 714 may be used to modify the laser temperature using data from the sampling circuit 706. Likewise, the cell temperature server 716 may be used to modify the cell temperature using data from the sampling circuit 706.

While the invention has been particularly shown and described with reference to specific embodiments thereof, it will be understood by those skilled in the art that changes in the form and details of the disclosed embodiments may be made without departing from the spirit or scope of the invention. For example, it will be understood that the various propensity-to-click metrics referred to herein are merely examples of metrics which may be employed with embodiments of the invention, and that embodiments are contemplated in which a wide variety of metrics may be employed in various combinations. In addition, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. A magnetometer comprising:
    a light emitter;
    an absorption cell containing a material that absorbs light from the light emitter at an increased amount when light from the light emitter has a wavelength equal to a center point of an absorption line; and
    wherein the light emitter is configured to vary the wavelength of the light it emits at a frequency equal to one half of a Larmor frequency and vary the wavelength such that a center point of the variation is at the center point of the absorption line.

2. The magnetometer of claim 1, wherein the light emitter is configured to vary the wavelength at a rate that is optimized to excite sub-lines within the absorption line.

3. The magnetometer of claim 1, further comprising:
    a detector configured to utilize measured light from extremes of the variation of the wavelength in order to correct for variation in light intensity.

4. The magnetometer of claim 1, wherein the light emitter is configured to vary the wavelength at a rate that makes an absolute value of the magnetometer insensitive to minor mistunings of the light emitter.

5. The magnetometer of claim 1, further comprising a temperature detecting component configured to utilize a vapor pressure within the absorption cell and an amount of light absorbed by the absorption cell to determine a temperature of the absorption cell.

6. The magnetometer of claim 5, further comprising a servo system configured to utilize the temperature of the absorption cell to maintain the temperature of the absorption cell at approximately a specific temperature.

7. The magnetometer of claim 1, further comprising a servo system configured to maintain a sweep rate of the light emitter centered at one half the Larmor frequency.

8. The magnetometer of claim 7, wherein the servo system is configured to be insensitive, to an angle of a magnetic field in which the magnetometer is placed, by using an amplitude of even harmonics of a Larmor modulation frequency caused by modulating the rate of sweeping of the light to either side of the absorption line.

9. The magnetometer of claim 1, further comprising a measurement component configured to obtain a measurement of an angle between a magnetic field and direction of the light by using an amplitude of even harmonics of a Larmor modulation frequency caused by modulating the rate of sweeping of the light to either side of the absorption line.

10. The magnetometer of claim 1, wherein the light emitter is configured to vary the wavelength at a rate that makes an absolute value of the magnetometer insensitive to minor mistunings of the light emitter and the magnetometer further comprises a measurement component configured to obtain a measurement of an angle between a magnetic field and direction of the light by using an amplitude of even harmonics of a Larmor modulation frequency caused by modulating the rate of sweeping of the light to either side of the absorption line.

11. The magnetometer of claim 10, wherein the light emitter is further configured to make frequency response less dependent on angle by using the amplitude of even harmonics.

12. The magnetometer of claim 11, wherein a function for frequency response correction is approximated by division.

13. The magnetometer of claim 12, further comprising a closed loop automatic gain control circuit configured to control the amplitude of the even harmonics.

14. The magnetometer of claim 12, further comprising an open loop homomorphic automatic gain control system configured to control the amplitude of the even harmonics.

15. The magnetometer of claim 11, wherein a function for frequency response correction is approximated by pulse width modulation.

16. The magnetometer of claim 15, wherein a signal for the pulse width modulation may be converted to a digital number.

17. The magnetometer of claim 16, wherein the digital number is a single bit.

18. The magnetometer of claim 16, wherein the digital number is used to increment or decrement a counter.

19. The magnetometer of claim 18, wherein the counter is used as an integrator portion of a servo system to cause a Larmor signal to track an ideal Larmor frequency.

20. The magnetometer of claim 19, wherein the counter is designed with a circuit that causes repeated bits of the same value to cause increasing increment values and different bits to cause decreasing increment values.

21. A method for approximation of a function for frequency response correction in a magnetometer, the method comprising:

measuring a displacement in time of zero crossings of a harmonic frequency, wherein the harmonic frequency comprises a small fundamental frequency developed by modulating a Larmor signal and a larger even harmonic frequency developed by modulating the Larmor signal; and approximating the amplitudes of the small fundamental frequency and the even harmonic frequency by using the displacement in time of zero crossings as a value for a ratio proportional to a ratio of the amplitudes.

* * * * *